(12) United States Patent
Kim

(10) Patent No.: US 12,742,806 B2
(45) Date of Patent: Sep. 22, 2026

(54) CAPACITANCE SENSING CIRCUIT

(71) Applicant: NXP B.V., Eindhoven (NL)

(72) Inventor: Geunwook Kim, Seoul (KR)

(73) Assignee: NXP B.V., Eindhoven (NL)

( * ) Notice: Subject to any disclaimer, the term of this patent is extended or adjusted under 35 U.S.C. 154(b) by 279 days.

(21) Appl. No.: 18/680,932

(22) Filed: May 31, 2024

(65) Prior Publication Data

US 2025/0370019 A1 Dec. 4, 2025

(51) Int. Cl.
*G01R 27/26* (2006.01)

(52) U.S. Cl.
CPC ................................ *G01R 27/2605* (2013.01)

(58) Field of Classification Search
CPC .. G01R 27/2605; G01R 31/64; G01R 31/016; G01R 31/312; G01D 5/24; G01D 5/14
See application file for complete search history.

(56) References Cited

U.S. PATENT DOCUMENTS 4,833,393 A 5/1989 Wetzel
6,657,420 B1 * 12/2003 Shacter .................. G05F 1/575 323/288
7,667,468 B1 2/2010 Anderson
8,436,263 B2 5/2013 Kremin
8,570,054 B2 10/2013 Hourne
9,244,569 B2 1/2016 Guedon et al.
9,587,964 B2 3/2017 Curtis
9,846,185 B2 12/2017 Nagaraj et al.
2005/0184786 A1 * 8/2005 Nishikawa ............... H03K 5/13 327/276
2017/0122986 A1 * 5/2017 Wang ..................... G01R 17/02

FOREIGN PATENT DOCUMENTS

CN 111595494 A 8/2020
KR 102589375 B1 10/2023

OTHER PUBLICATIONS

Bruschi, Paolo et al.: "A Current-Mode, Dual Slope, Integrated Capacitance-to-Pulse Duration Converter"; IEEE Journal of Solid-State Circuits; vol. 42, No. 9; Sep. 2007; 8 pages.

* cited by examiner

*Primary Examiner* — Lee E Rodak
*Assistant Examiner* — Jeremiah J Barron

(57) ABSTRACT

A capacitance sensing circuit and method uses a current pulse to charge an external capacitor. A first voltage associated with the external capacitor is converted to current to charge an internal capacitor. A second voltage, which is associated with the internal capacitor that corresponds to the first voltage, is compared with an adjustable threshold voltage to generate a toggle signal. The adjustable threshold voltage is changed in response to the toggle signal, which is associated with a capacitance of the external capacitor.

20 Claims, 12 Drawing Sheets

CAPACITANCE SENSING CIRCUIT

BACKGROUND

Capacitance sensing circuits can be used in devices to measure external capacitance for various applications. As an example, a capacitance sensing circuit may be included in power management integrated circuit (PMIC) chips, which may be used in chargers for battery detection or in DC-DC regulators for output capacitor detection.

SUMMARY

A capacitance sensing circuit and method uses a current pulse to charge an external capacitor. A first voltage associated with the external capacitor is converted to current to charge an internal capacitor. A second voltage, which is associated with the internal capacitor that corresponds to the first voltage, is compared with an adjustable threshold voltage to generate a toggle signal. The adjustable threshold voltage is changed in response to the toggle signal, which is associated with a capacitance of the external capacitor.

In an embodiment, a capacitance sensing circuit comprises a current pulse generator configured to generate a current pulse to charge an external capacitor, a voltage-to-current converter to convert a first voltage associated with the external capacitor to current to charge an internal capacitor, a comparator operably connected to the internal capacitor to generate a toggle signal when a second voltage corresponding to the first voltage reaches an adjustable threshold voltage, and a processing unit operably connected to the comparator to change the adjustable threshold voltage in response to the toggle signal generated by the comparator, wherein the toggle signal is associated with a capacitance of the external capacitor.

In an embodiment, the capacitance sensing circuit further comprises a resistor ladder connected to the comparator via switches to provide the adjustable threshold voltage.

In an embodiment, the processing unit includes a switch controller configured to provide signals to the switches to control the adjustable threshold voltage.

In an embodiment, the processing unit further includes flip-flops connected to provide input signals to the switch controller, wherein the flip-flops are connected to the comparator to receive the toggle signal to generate the input signals.

In an embodiment, the flip-flops are connected such that an output of at least one of the flip-flops is an input to another one of the flip-flops.

In an embodiment, the flip-flops are connected such that an output of a first flip-flop is an input to a second flip-flop, an output of the second flip-flop is an input to a third flip-flop, and an output of the third flip-flop is an input to a fourth flip-flop.

In an embodiment, the switch controller includes AND gates connected to outputs of the flip-flops to generate the signals.

In an embodiment, the voltage-to-current converter includes a current mirror connected to the internal capacitor, the current mirror being controlled by a transistor that is controlled by the first voltage.

In an embodiment, the voltage-to-current converter further includes an amplifier connected to a control terminal of the transistor to control the transistor based on the first voltage.

In an embodiment, the capacitance sensing circuit further comprises a discharge transistor connected to the internal capacitor and controlled by the toggle signal from the comparator to discharge the internal capacitor.

In an embodiment, the current pulse generator includes a current generator and a timing circuit operably connected to the current generator to generate the current pulse.

In an embodiment, a method comprises generating a current pulse to charge an external capacitor, converting a first voltage associated with the external capacitor to current to charge an internal capacitor, comparing a second voltage with an adjustable threshold voltage to generate a toggle signal, the second voltage being associated with the internal capacitor that corresponds to the first voltage, and changing the adjustable threshold voltage in response to the toggle signal generated by the comparator, wherein the toggle signal is associated with a capacitance of the external capacitor.

In an embodiment, changing the adjustable threshold voltage includes closing a switch connected to a resistor ladder to change the adjustable threshold voltage.

In an embodiment, the method further comprises applying the toggle signal to flip-flops to generate a signal to close the switch.

In an embodiment, a capacitance sensing circuit comprises a current pulse generator configured to generate a current pulse to charge an external capacitor, a voltage-to-current converter to convert a first voltage associated with the external capacitor to current to charge an internal capacitor, a comparator operably connected to the internal capacitor to generate a toggle signal when a second voltage corresponding to the first voltage reaches an adjustable threshold voltage, a resistor ladder connected to the comparator via switches to provide the adjustable threshold voltage, and a switch controller operably connected to the switches to provide signals to the switches to control the adjustable threshold voltage based on the toggle signal, wherein the toggle signal is associated with a capacitance of the external capacitor.

In an embodiment, the capacitance sensing circuit further comprises flip-flops connected to provide input signals to the switch controller, wherein the flip-flops are connected to the comparator to receive the toggle switch to generate the input signals.

In an embodiment, the flip-flops are connected such that an output of at least one of the flip-flops is an input to another one of the flip-flops.

In an embodiment, the voltage-to-current converter includes a current mirror connected to the internal capacitor, the current mirror being controlled by a transistor that is controlled by the first voltage.

In an embodiment, the capacitance sensing circuit further comprises a discharge transistor connected to the internal capacitor and controlled by the toggle signal from the comparator to discharge the internal capacitor.

In an embodiment, the current pulse generator includes a current generator and a timing circuit operably connected to the current generator to generate the current pulse.

These and other aspects in accordance with embodiments will become apparent from the following detailed description, taken in conjunction with the accompanying drawings, illustrated by way of example of the principles of the embodiments.

BRIEF DESCRIPTION OF THE DRAWINGS

Throughout the description, similar reference numbers may be used to identify similar elements.

DETAILED DESCRIPTION

Figure 1:
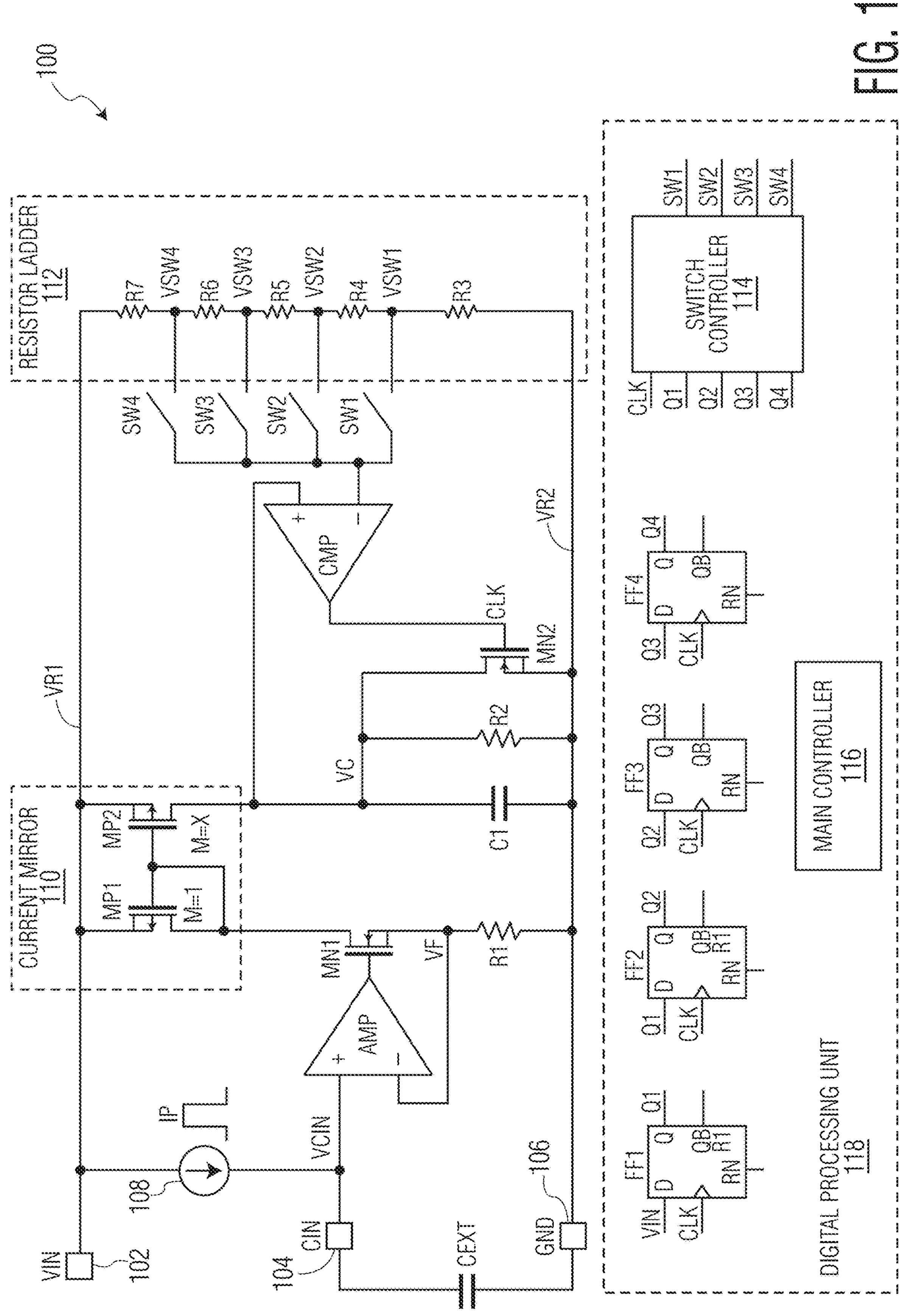
FIG. 1 is a diagram of a capacitance sensing circuit in accordance with an embodiment of the invention.

It will be readily understood that the components of the embodiments as generally described herein and illustrated in the appended figures could be arranged and designed in a wide variety of different configurations. Thus, the following more detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The present invention may be embodied in other specific forms without departing from its spirit or essential characteristics. The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

As used herein, the term "coupled" or "connected" includes directly coupled or directly connected so that one element is directly coupled or connected to another element, and indirectly coupled or indirectly connected so that one element is indirectly coupled or connected to another element, i.e., one or more elements may be present between the coupled or connected elements.

Reference throughout this specification to "one embodiment", "an embodiment", or similar language means that a particular feature, structure, or characteristic described in connection with the indicated embodiment is included in at least one embodiment of the present invention. Thus, the phrases "in one embodiment", "in an embodiment", and similar language throughout this specification may, but do not necessarily, all refer to the same embodiment.

Turning now to FIG. 1, a capacitance sensing circuit 100 in accordance with an embodiment of the invention is shown. The capacitance sensing circuit 100 operates to measure the capacitance of an external capacitor Cext and derive a digital code or value of the capacitance measurement. Compared to some conventional capacitance sensing circuits, the capacitance sensing circuit 100 has a less complex and cost effective design, which allows the capacitance sensing circuit 100 to be readily incorporated into an integrated circuit (IC) chip, such as power management integrated circuit (PMIC) chips.

As shown in FIG. 1, the capacitance sensing circuit 100 includes a Vin terminal 102, a Cin terminal 104 and a low voltage terminal 106, which may be ground (GND) terminal. The Vin terminal 102 is used to connect to a power source (not shown) to provide an input voltage Vin to the capacitance sensing circuit 100. The Cin terminal 104 is used to connect to the external capacitor Cext (i.e., not part of the capacitance sensing circuit 100), which may represent the capacitance of an external device, such as a battery, or a regulator output. The low voltage terminal 106 is used to connect the capacitance sensing circuit 100 to a voltage lower than the input voltage Vin, e.g., ground.

The Vin terminal 102 is connected to a current pulse generator 108, a current mirror 110 and a resistor ladder 112 via a high voltage rail VR1. The current pulse generator 108 is also connected to the Cin terminal 104 at a VCIN node between the Cin terminal to a positive input of an amplifier AMP. The current pulse generator 108 is used to generate a current pulse IP to charge the external capacitor Cext. The low voltage terminal 106 is connected to a low voltage rail VR2 of the capacitance sensing circuit 100.

The current mirror 110 includes a pair of transistors MP1 and MP2. In the illustrated embodiment, the transistors MP1 and MP2 are p-channel metal-oxide-semiconductor (PMOS) transistors. However, in other embodiments, the transistors MP1 and MP2 may be any kind of transistors. As shown in FIG. 1, the gates (i.e., control terminals) of the transistors MP1 and MP2 are connected to each other and connected to the source of the transistor MP1. The size of the transistor MP2 may be a multiple of the size of the transistor MP1. The transistor MP1 is connected in series with a transistor MN1 and a resistor R1 between the high voltage rail VR1 and the low voltage rail VR2.

In the illustrated embodiment, the transistor MN1 is an n-channel metal-oxide-semiconductor (NMOS) transistor. However, in other embodiments, the transistor MN1 may be any kind of a transistor. The gate of the transistor MN1 is connected to the output of the amplifier AMP. As noted above, the positive input of the amplifier AMP1 is connected to the VCIN node. A negative input of the amplifier AMP is connected to a VF node, which is located between the transistor MN1 and the resistor R1.

The transistor MP2 is connected in series with an internal capacitor C1 between the high voltage rail VR1 and the low voltage rail VR2. The internal capacitor C1 is connected in parallel with a resistor R2 and a transistor MN2, which are each connected between a VC node, which is located between the transistor MP2 and the capacitor C1, and the low voltage rail VR2. Similar to the transistor MN1, the transistor MN2 is an NMOS transistor. However, in other embodiments, the transistor MN2 may be any kind of a transistor.

The resistor ladder 112 includes resistors R3, R4, R5 and R6 connected in series between the high voltage rail VR1 and the low voltage rail VR2. These resistors are connected to switches SW1, SW2, SW3 and SW4. The switch SW1 is connected to a VSW1 node between the resistors R3 and R4, and to a negative input of a comparator CMP. Similarly, the switch SW2 is connected to a VSW2 node between the resistors R4 and R5, and to the negative input of the comparator CMP, the switch SW3 is connected to a VSW3 node between the resistors R5 and R6, and to the negative input of the comparator CMP, and the switch SW4 is connected to a node VSW4 between the resistors R6 and R7, and to the negative input of the comparator CMP.

The positive input of the comparator CMP is connected to the source of the transistor MP2. The output of the comparator CMP is connected to the gate of the transistor MN2 to provide a signal CLK. The signal CLK is also provided to the flip flops FF1, FF2, FF3 and FF4 to generate signals Q1, Q2, Q3 and Q4, which are used by a switch controller 114 to generate SW1, SW2, SW3 and SW4 signals selectively close the switches SW1, SW2, SW3 and SW4. The flip flops FF1, FF2, FF3 and FF4 and the switch controller 114 are operably connected to a main controller 116, which controls various components of the capacitance sensing circuit 100 and receives or monitors different signals that are used or generated by the components. In the illustrated embodiment, the flip flops FF1, FF2, FF3 and FF4, the switch controller 114 and the main controller 114 are digital devices, which are part of a digital processing unit 118.

Figure 4A:
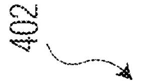
FIGS. 4A-4G show components of the capacitance sensing circuit in accordance with a particular implementation.
Figure 4A:
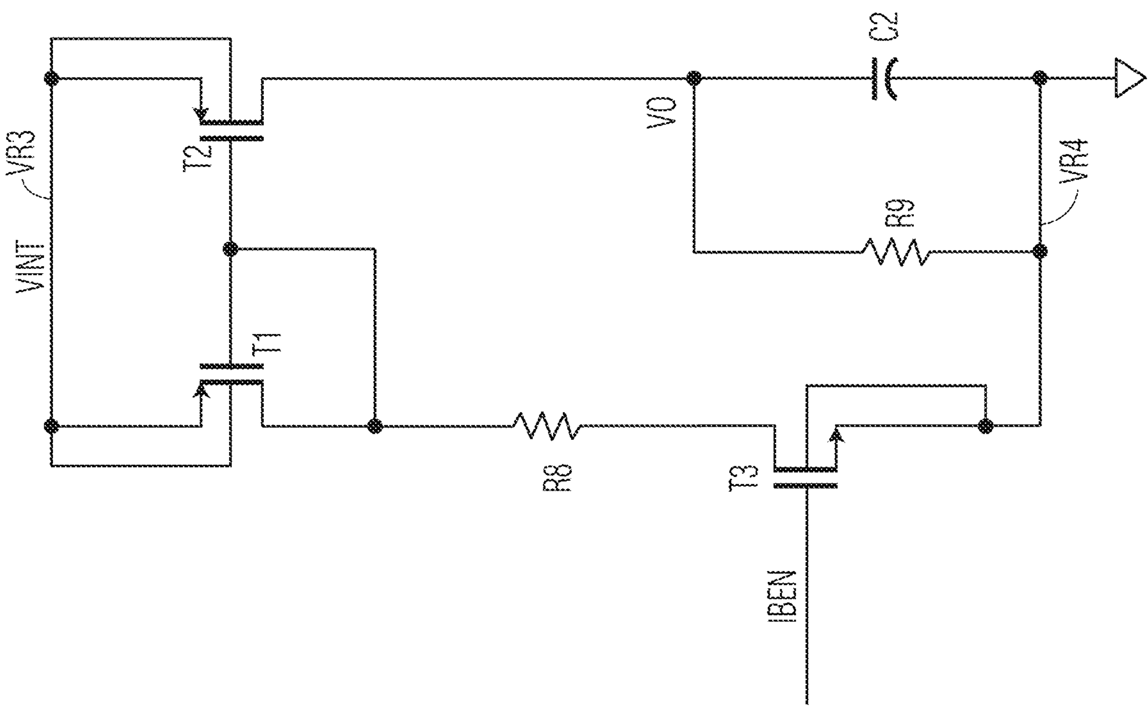
Figure 4B:
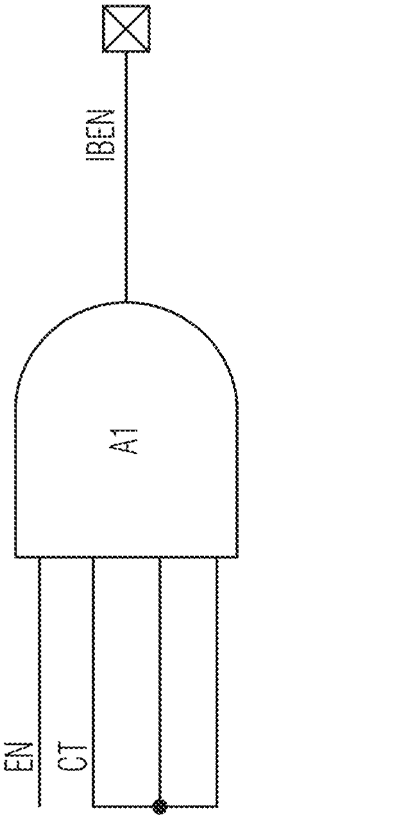
Figure 4C:
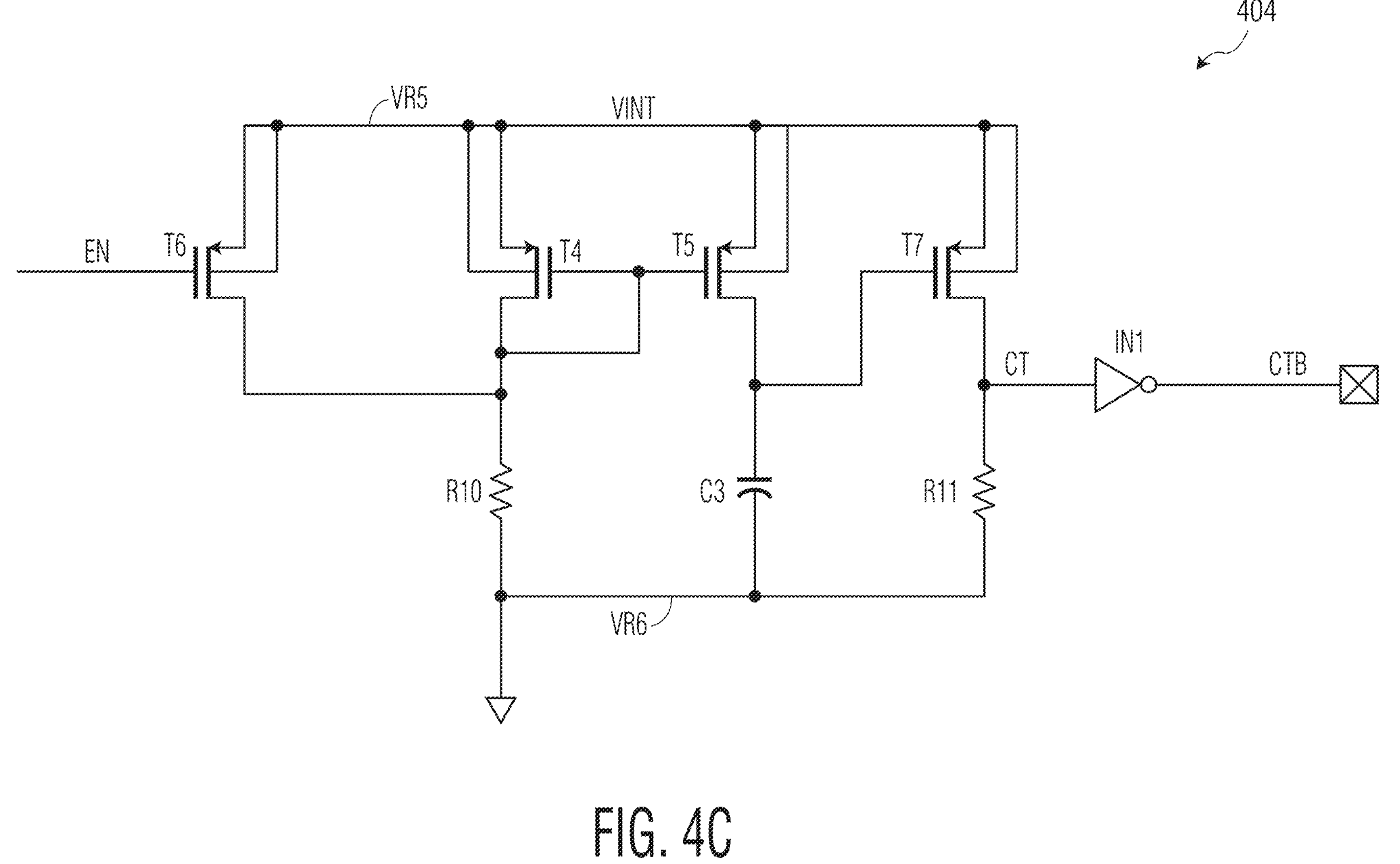

In operation, the current pulse generator 108 is used to generate the current pulse IP to charge the external capacitor Cext during a constant time, which may be generated by a timing circuit 404 of the current pulse generator 108 shown in FIG. 4C. The charged voltage at the node VCIN is converted to current by the voltage at the VF node divided by the resistance of the resistor R1, which equals the charged voltage at the VCIN node divided by the resistance of the resistor R1. In particular, the amplifier AMP is used to control the transistor MN1 to generate the current through the VF node. This current is mirrored by the current mirror 110 to produce a multiplied current, which charges the internal capacitor C1. Thus, the current mirror 110, the amplifier AMP and the transistor MN1 are used as parts of a voltage-to-current converter to charge the internal capacitor C1. Consequently, the current mirror 110 can be viewed as an internal charging component that charges the internal capacitor C1.

The maximum charged voltage of the internal capacitor C1 is the current through the VC node times the resistance of the resistor R2. The transistor MN2 is used as a discharging transistor to discharge the internal capacitor C1. The transistor MN2 is controlled by the comparator CMP via the output CLK signal at the gate of the transistor MN2. The output CLK signal is generated by the comparator CMP by comparing the voltage at the node VC with an adjustable reference voltage, which is used as a threshold voltage for the comparator CMP.

The internal capacitor C1 is discharged when its charged voltage reaches a threshold of the comparator CMP, which is dependent on the particular switch among the switches SW1, SW2, SW3 and SW4 that is closed. The output of the comparator CMP toggles from low to high and then back to low, which will be referred to herein as a toggle signal. The charged voltage at the VC node becomes higher whenever the CLK signal is toggled. Thus, the internal capacitor C1 is recharged when the output of the comparator CMP is low after a toggle. The threshold of the comparator CMP is changed or adjusted from the lowest threshold (i.e., when the switch SW1 is closed) to the highest threshold (i.e., when the switch SW4 is closed). The threshold or reference voltage of the comparator CMP is changed by the switches SW1, SW2, SW3 and SW4, which are controlled by the flip-flops FF1, FF2, FF3 and FF4 and the switch controller 114.

The comparator CMP continues to toggle until the charged voltage of the internal capacitor C1, i.e., the maximum internal charging voltage at the VC node, does not reach the next threshold voltage. Thus, the current mirror 110 and the comparator CMP are used as a clock generator to continue to toggle until the maximum charged voltage of the internal capacitor C1 is lower than the next threshold voltage. The toggle count is stored at the flip-flops FF1, FF2, FF3 and FF4, which can be converted to a digital code or value that represents the capacitance of the external capacitor Cext by the main controller 116, which may be a processor or any signal processing device. The capacitance sensing circuit 100 may be disabled so that the external capacitor Cext can be used for a different purpose. The capacitance sensing circuit can be disabled when the CLK signal remains low, i.e., stops the toggle, during the constant time.

Figure 2:
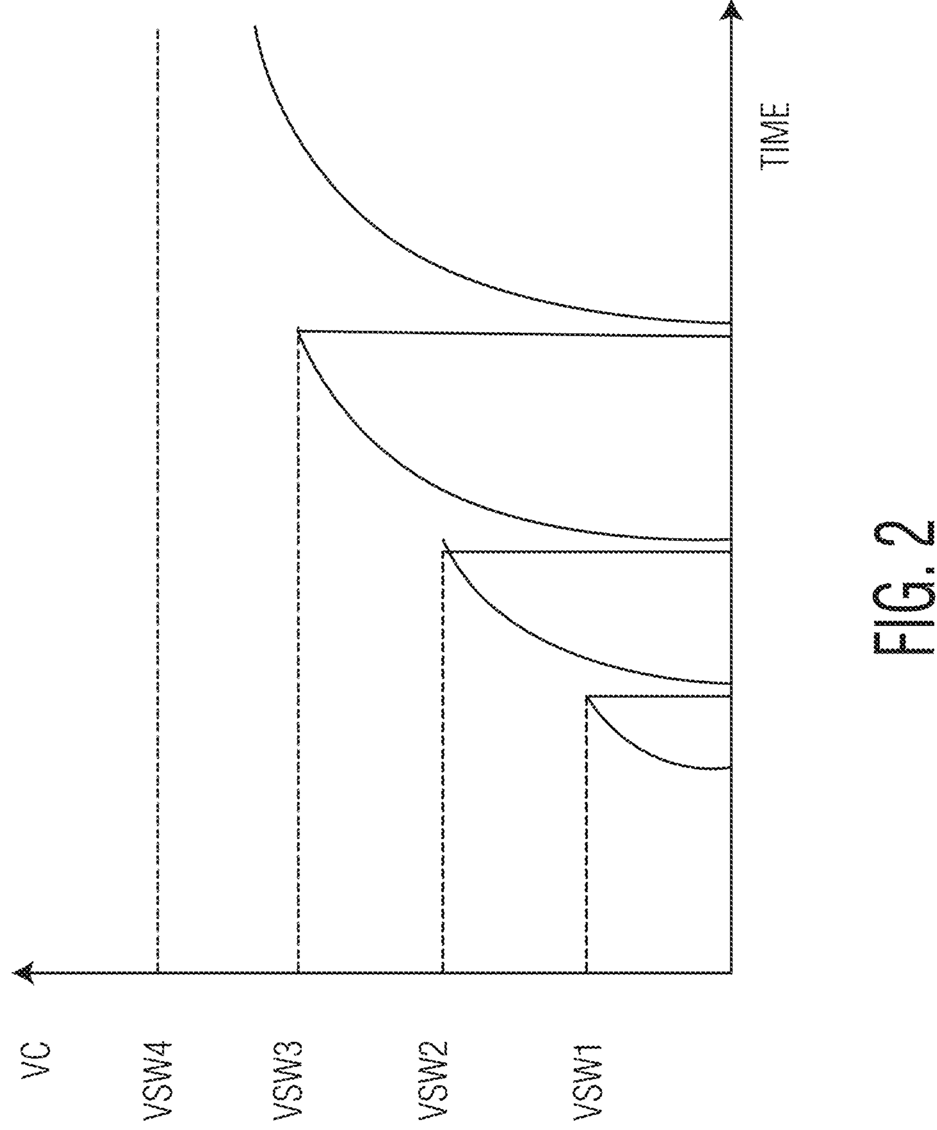
FIG. 2 illustrates the charged voltage of an internal capacitor of the capacitance sensing circuit over time in accordance with an embodiment of the invention.

FIG. 2 illustrates the charged voltage of the internal capacitor C1 at the VC node (i.e., the charged voltage VC) over time in accordance with an embodiment of the invention. As shown in FIG. 2, initially when the threshold voltage of the comparator CMP is set to VSW1, the changed voltage VC rises until the charged voltage VC reaches the threshold voltage VSW1. Then, the charged voltage VC drops when the comparator CMP generates a high CLK signal, i.e., a toggle signal, which activates the transistor NM2, discharging the internal capacitor C1, and toggles the flip-flop FF1 so that the next threshold voltage VSW2 is set by the switch controller 114. The process is repeated for the threshold voltage VSW2 and the threshold voltage VSW3. In the illustrated example, after the threshold voltage VSW4 is set, the charged voltage VC does not reach the threshold voltage VSW4. Thus, the digital code that represents the capacitance of the external capacitor is generated by flip-flop output Q1, Q2, Q3 and Q4, e.g., 1110.

Figure 3:
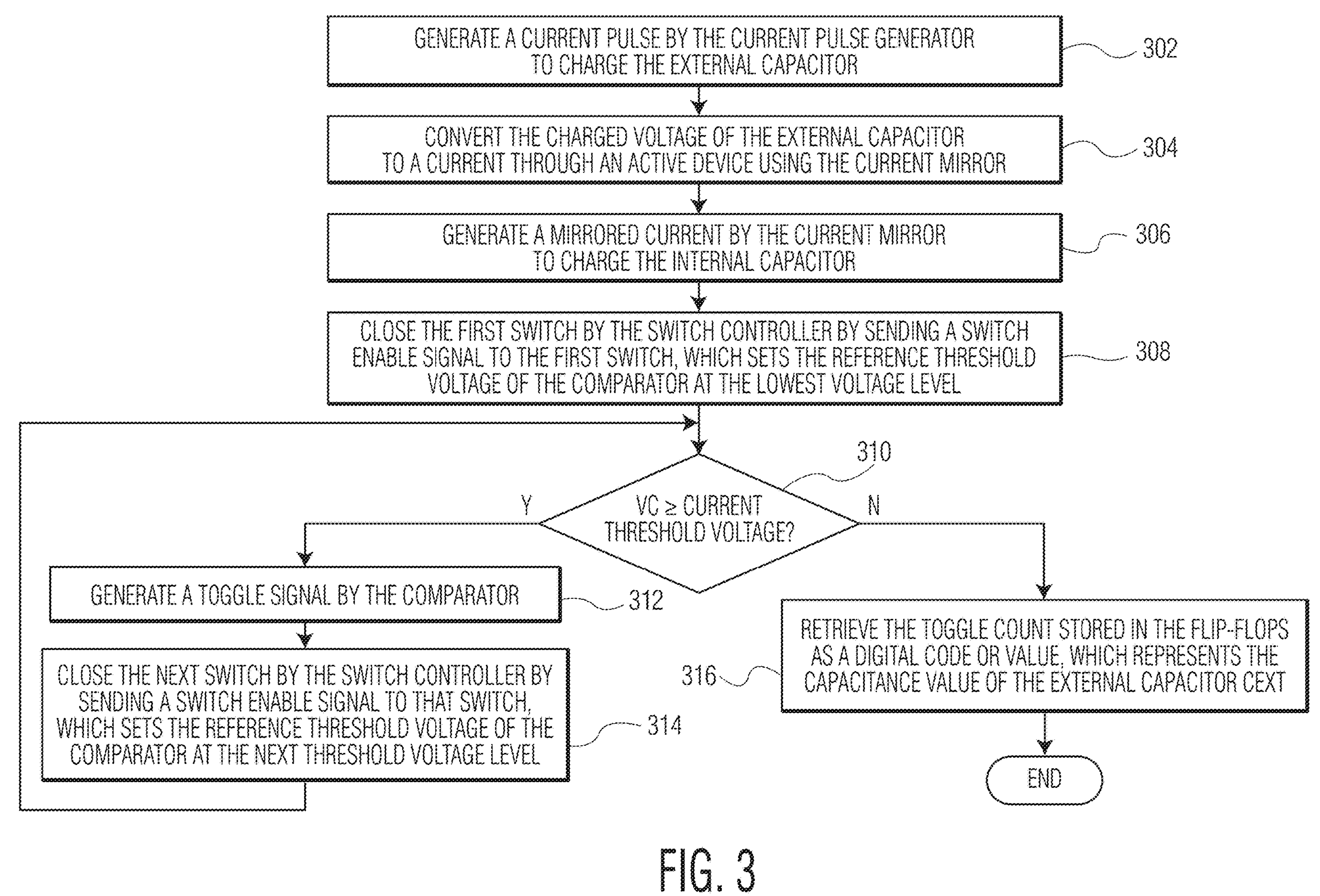
FIG. 3 is flow diagram of an operational process of the capacitance sensing circuit in accordance with an embodiment of the invention.

Turning now to FIG. 3, a process flow diagram of an operational process of the capacitance sensing circuit 100 in accordance with an embodiment of the invention is shown. At step 302, a current pulse IP is generated by the current pulse generator 108 to charge the external capacitor Cext. At step 304, the charged voltage of the external capacitor Cext is converted to current through an active device, i.e., the transistor MN1, using the current mirror 110. The magnitude or strength of the current through the transistor MN1 is the voltage at the VF node divided by the resistance of the resistor R1.

At step 306, a mirrored current of the current through the first active device is generated by the current mirror 108 to charge the internal capacitor C1. At step 308, the first switch SW1 is closed by the switch controller 114 by sending a switch enable signal, i.e., the SW1 signal, to the first switch SW1, which sets the reference threshold voltage of the comparator CMP at the lowest voltage level, i.e., the VSW1 voltage.

At step 310, if the charged voltage at the node VC is not equal to or greater than the current reference threshold voltage (e.g., when the charged voltage at the node VC reaches the current reference threshold voltage), the process proceeds to step 316, where the toggle count stored in the flip-flops are retrieved as a digital code or value, which represents the capacitance value of the external capacitor Cext. However, if the charged voltage at the node VC is equal to or great than the current threshold voltage, the process proceeds to step 312, where a toggle signal, i.e., a high CLK signal, is generated by the comparator CMP1, which activates the transistor MN2 to discharge the internal capacitor C1 and toggles the next flip-flop, e.g., the flip-flop FF2, FF3 or FF4. Next, at step 314, the next switch, e.g., the switch SW2, SW3 or SW4, is closed by the switch controller 114 by sending a switch enable signal to that switch, which sets the reference threshold voltage of the comparator CMP at the next threshold voltage level, the VSW2, VSW3 or VSW3 voltage. The process then proceeds back to step 310 until the charged voltage at the VC node does not exceed the set reference threshold voltage, which means that the capacitance measurement is complete and a digital code or value that represents the capacitance of the external capacitor Cext can be extracted.

Turning now to FIGS. 4A-4G, components of the capacitance sensing circuit 100 in accordance with a particular implementation are illustrated. In FIGS. 4A-4G, signals or voltages are used by the components of the capacitance sensing circuit 100. These signals or voltages include the Vint voltage, the VV voltage, the VRR voltage, the EN signal and ground G. The Vint voltage is the digital supply voltage of the capacitance sensing circuit 100 and the VV voltage is the analog supply voltage of the capacitance sensing circuit 100. The VRR voltage is the reference voltage used by the capacitance sensing circuit 100. At least some of these signals or voltages may be generated using appropriate current sources.

FIG. 4A shows components of a current generating circuit 402 of the current pulse generator 108, which provides the current pulse IP. The current generating circuit 402 includes a pair of transistors T1 and T2. As shown in FIG. 4A, the gates of the transistors T1 and T2 are connected to each other and also connected to the source of the transistor T1. The transistor T1 is connected in series with a resistor R8, and a transistor T3 between a high voltage rail VR3 with the Vint voltage and a low voltage rail VR4, which may be ground. The transistor T2 is controlled by an IBEN signal, which is provided by a 4-input AND gate A1 shown in FIG. 4B. The inputs to the 4-input AND gate A1 are the EN signal and a CT signal, which is provided by a timing circuit 404 of the current pulse generator 108 shown in FIG. 4C.

Turning back to FIG. 4A, the transistor T2 is connected to a capacitor C2, which is connected in parallel with a resistor R9. The capacitance of the capacitor C2 may be chosen to reflect the expected capacitance of the external capacitor Cext shown in FIG. 1. When enabled by the IBEN signal, a current pulse IP is generated at a VO node between the transistor T2 and the capacitor C2. The VO node is equivalent to the VCIN node shown in FIG. 1.

The timing circuit 404 shown in FIG. 4C includes a pair of transistors T4 and T5. As shown in FIG. 4C, the gates of the transistors T4 and T5 are connected to each other and also connected to the source of the transistor T4. The transistor T4 is connected in series with a resistor R10 between a high voltage rail VR5 with the Vint voltage and a low voltage rail VR6, which may be ground. The transistor T5 is connected in series with a capacitor C3 between the high voltage rail VR5 and the low voltage rail VR6.

The timing circuit 404 further includes transistors T6 and T7. The transistor T6 is connected between the high voltage rail VR4 and a node between the transistor T4 and the resistor R10. The transistor T6 is controlled by the EN signal. The transistor T7 is connected is series with a resistor R11 between the high voltage rail VR5 and the low voltage rail VR6. At a node between the transistor T7 and the resistor R11, the CT signal is generated, which may be inverted to generate a CTB signal using an inverter IN1.

Figure 4D:
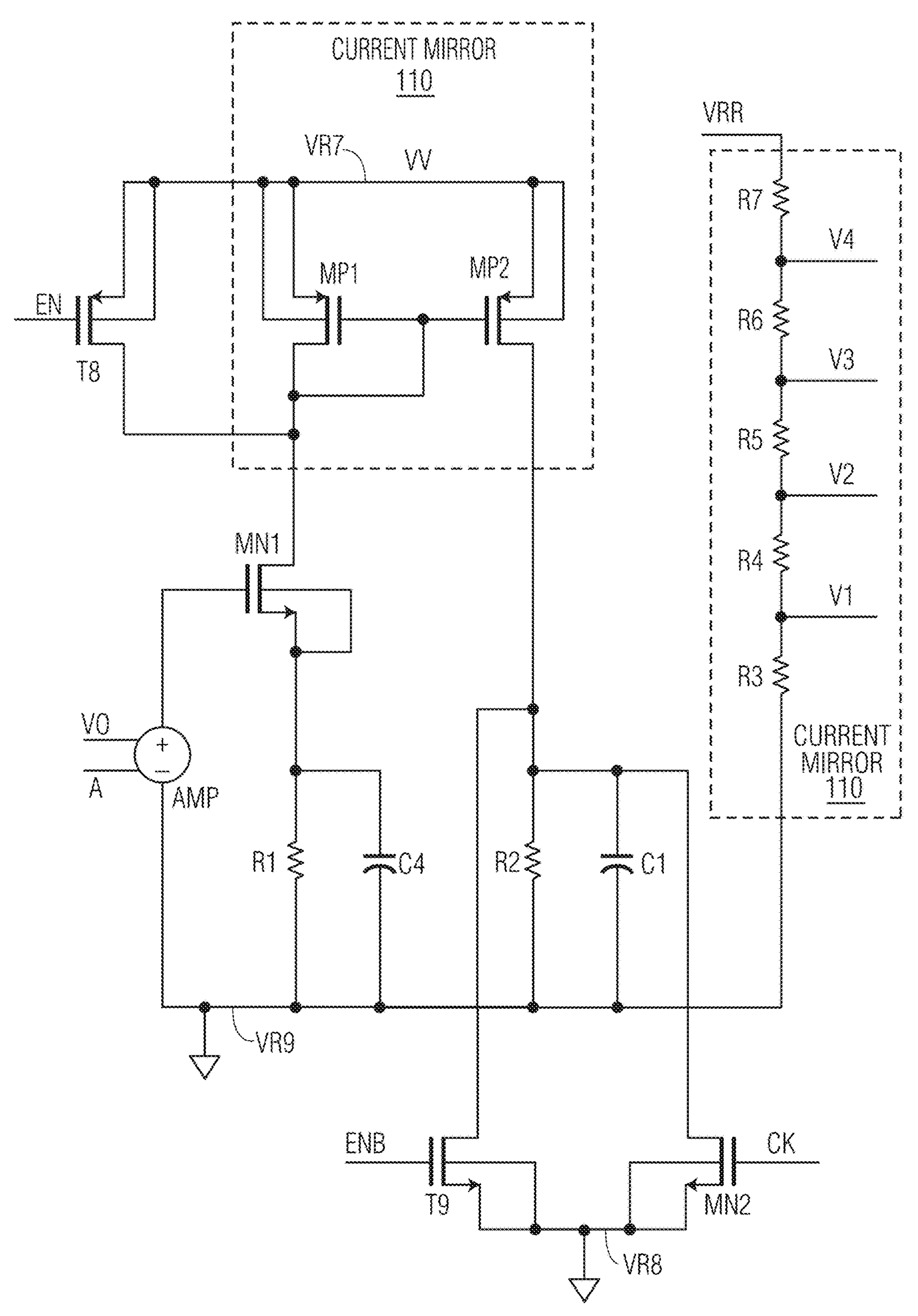

Turning now to FIG. 4D, the resistor ladder 112, the current mirror 110, the amplifier AMP, the transistors MN1 and MN2, the resistors R1 and R2, the internal capacitor C1 of the capacitance sensing circuit 100 are shown. The resistors R3, R4, R5, R6 and R7 of the resistor ladder 112 provide V1, V2, V3 and V4 voltages at different nodes between the resistors. The V1, V2, V3 and V4 voltages are equivalent to the VSW1, VSW2, VSW3 and VSW4 voltages shown in FIG. 1.

In this implementation, there are transistors T8 and T9 that are controlled by the signal EN and its inverted signal ENB, respectively, and another capacitor C4, which is a noise decoupling capacitor. The transistor T8 is connected between a VV high voltage rail VR7 and a node between the transistor MP1 and the transistor MN1. The transistor T9 is connected between a node between the transistor MP2 and the resistor R2 and a low voltage rail VR8. The capacitor C4 is also connected between a node between the transistor MP2 and the resistor R2 and a low voltage rail VR9.

Figure 4E:
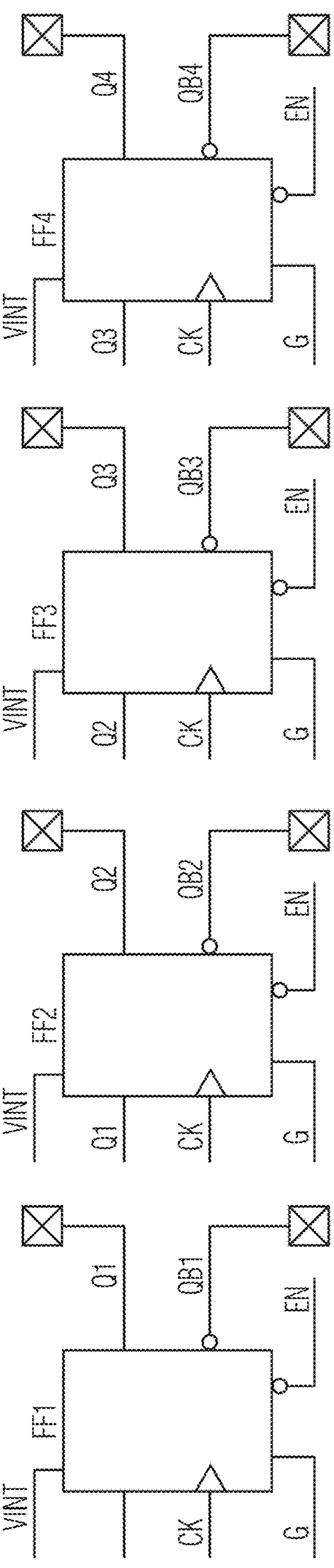

Turning now to FIG. 4E, the flip-flops FF1, FF2, FF3 and FF4 of the capacitance sensing circuit 100 are shown. Each of the flip-flops are provided with the VINT supply voltage, the EN signal and ground connection. The inputs to the flip-flop FF1 are the VV voltage or signal and the CK signal, which is equivalent to the CLK signal shown in FIG. 1. The outputs of the flip-flop FF1 are a Q1 signal and its inverted QB1 signal. The inputs to the flip-flop FF2 are the Q1 signal and the CK signal. The outputs of the flip-flop FF2 are a Q2 signal and its inverted QB2 signal. The inputs to the flip-flop FF3 are the Q2 signal and the CK signal. The outputs of the flip-flop FF3 are a Q3 signal and its inverted QB3 signal. The inputs to the flip-flop FF4 are the Q3 signal and the CK signal. The outputs of the flip-flop FF4 are a Q4 signal and its inverted QB4 signal.

Figure 4F:
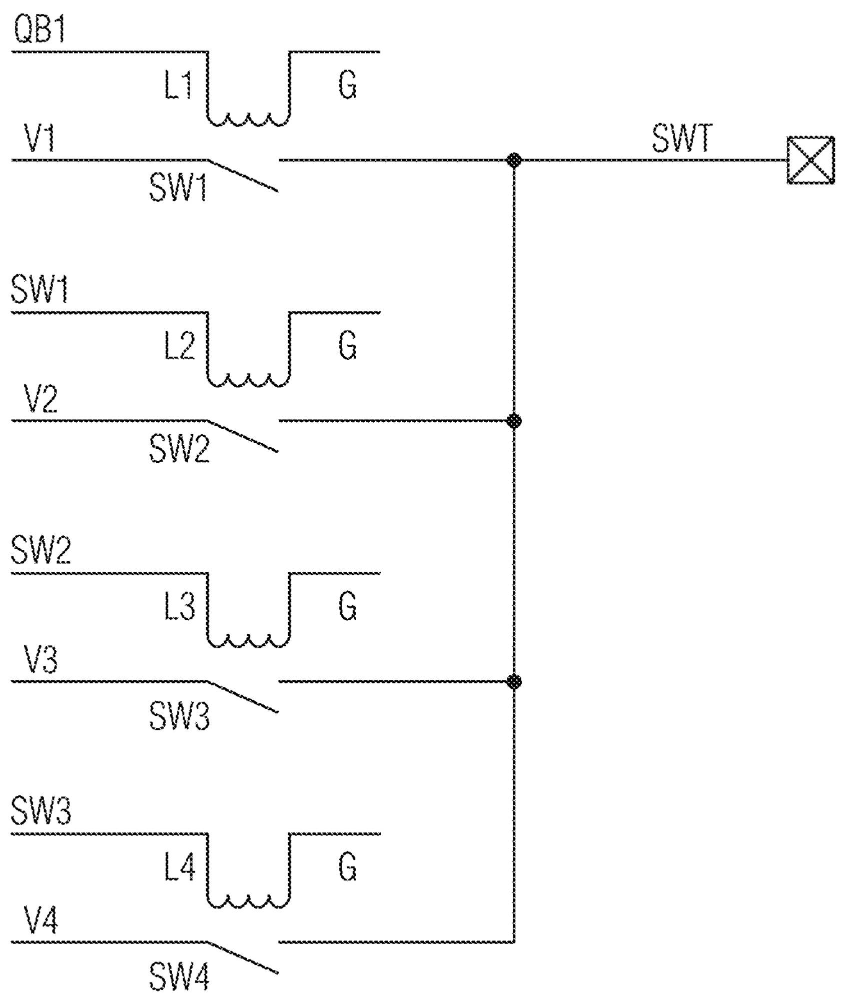

Turning now to FIG. 4F, the switches SW1, SW2, SW3 and SW4 of the capacitance sensing circuit 100 are shown. When activated (i.e., closed), the switches SW1, SW2, SW3 and SW4 selectively provide one of the voltages V1, V2, V3 and V4, which is used as a threshold reference SWT for the comparator CMP (not shown in FIGS. 4A-4G. The switches SW1, SW2, SW3 and SW4 are controlled by inductors L1, L2, L3 and L4, respectively, using QB1, SW1, SW2 and SW3 signals.

Figure 4G:
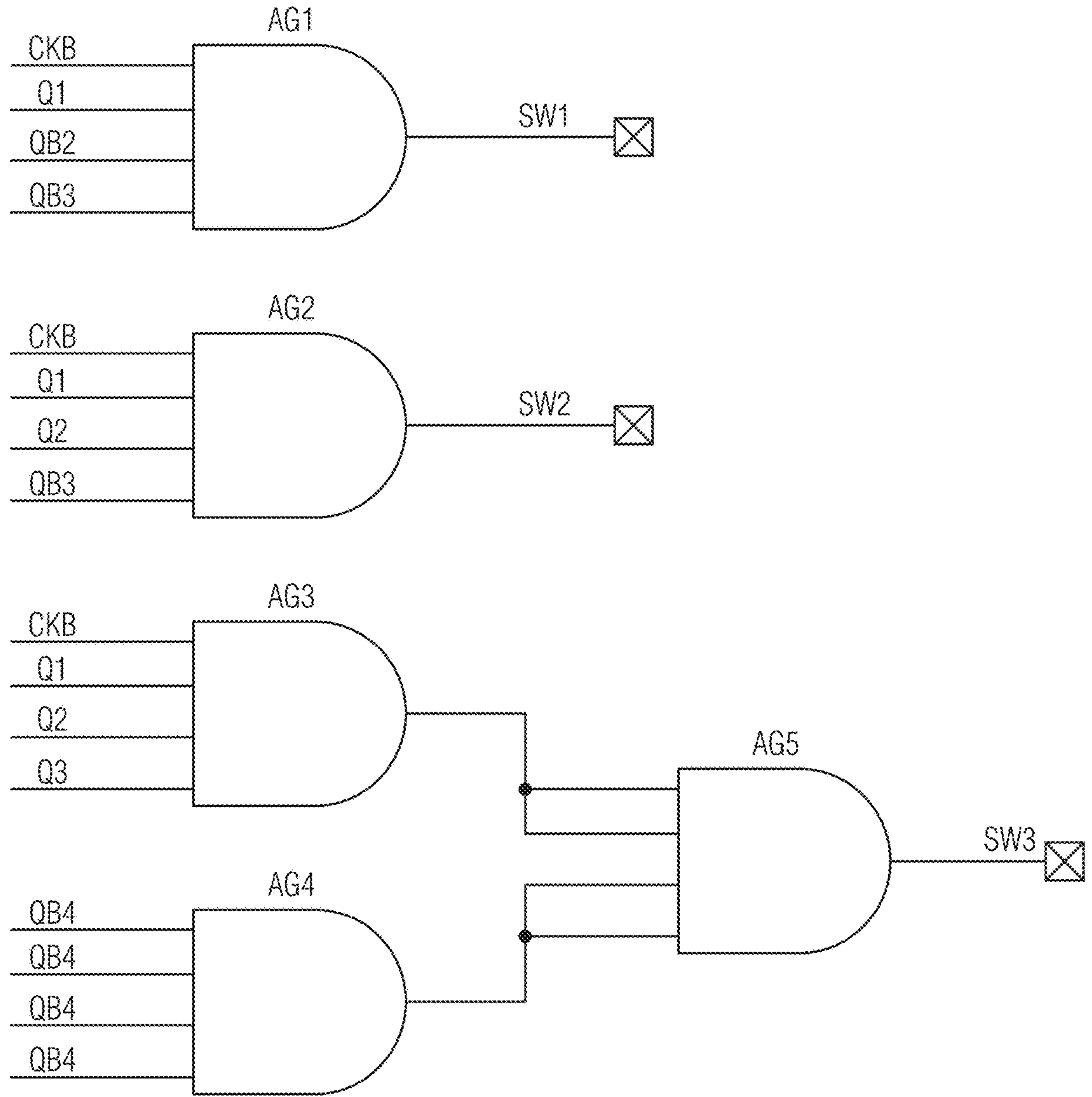

Turning now to FIG. 4G, components of the switch controller 114 are shown. The switch controller 114 includes a number of 4-input AND gates AG1, AG2, AG3, AG4 and AG5. The AND gate AG1 is used to generate the SW1 signal using CKB, Q1, QB2 and QB3 signals as input signals, and the AND gate AG2 is used to generate the signal SW2 using the input signals CKB, Q1, Q2 and QB3 signals as input signals. The CKB signal is an inverted signal of the CK signal. The AND gates AG3, AG4 and AG51 are used to generate the SW3 signal using CKB, Q1, Q2 and Q3 signals as input signals to the AND gate AG1 and using a QB4 signal as the input signals to the AND gate AG4.

Figure 5:
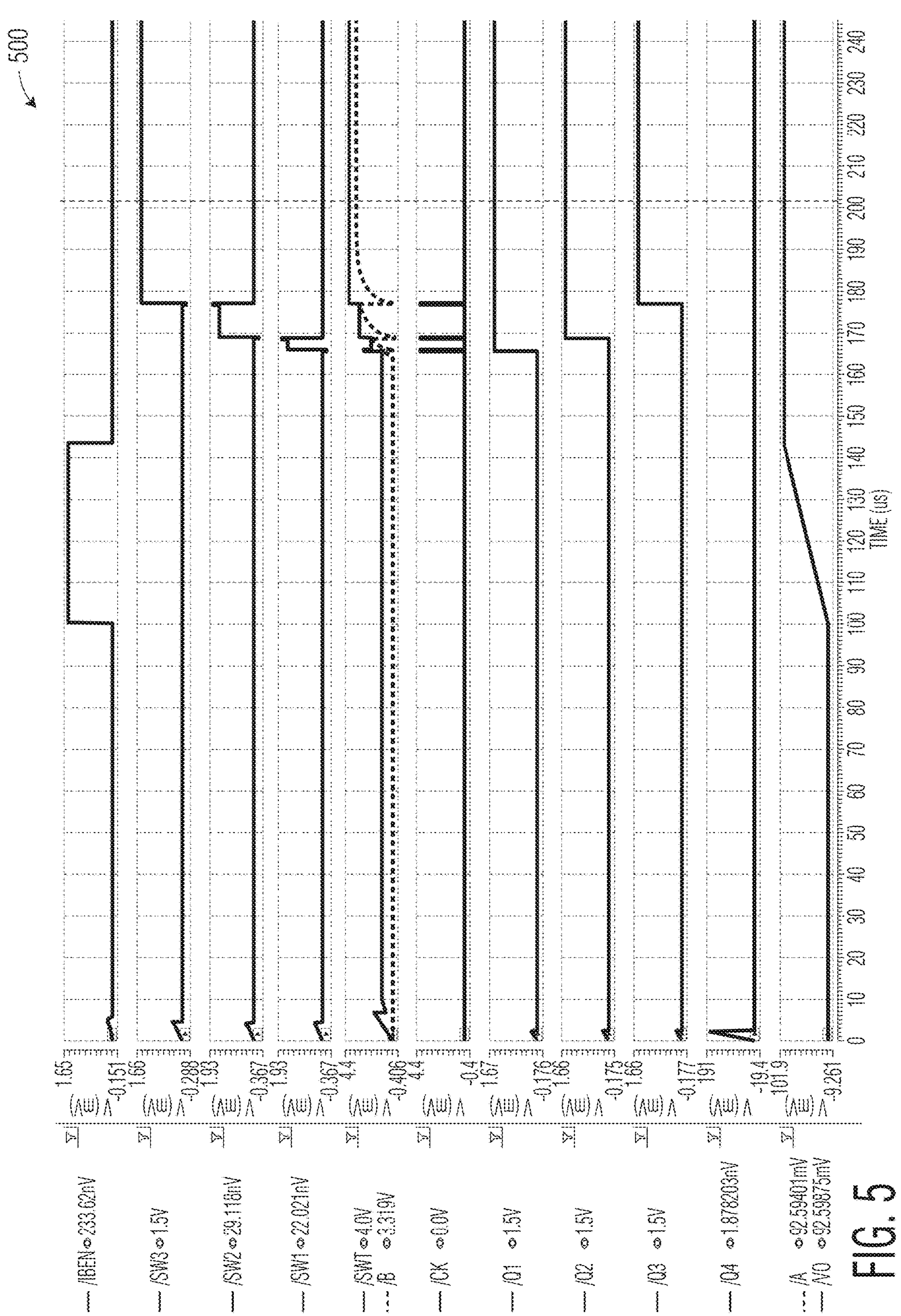
FIG. 5 shows a timing diagram of the various signals used for the components of the capacitance sensing circuit shown in FIGS. 4A-4G.

FIG. 5 shows a timing diagram 500 of the various signals used for the components of the capacitance sensing circuit 100 shown in FIGS. 4A-4G. The timing diagram 500 shows the IBEN signal, which is used to generate the current pulse IP that charges the external capacitor Cext. In response to the current pulse IP, the voltage of the signal VO is increased as the external capacitor Cext is charged by the current pulse IP. The CK signal is shown to have three spikes (i.e., three toggle signals), which correspond to when the output signal at the node B exceeds the signal or voltage SWT. The node B is equivalent to the VC node in FIG. 1. Also shown in the timing diagram 500 are the SW1, SW2 and SW3 signals, which operate the switches SW2, SW3 and SW4, respectively, and the Q1, Q2, Q3 and Q4 signals, which are generated by the flip-flops FF1, FF2, FF3 and FF4, respectively.

Figure 6:
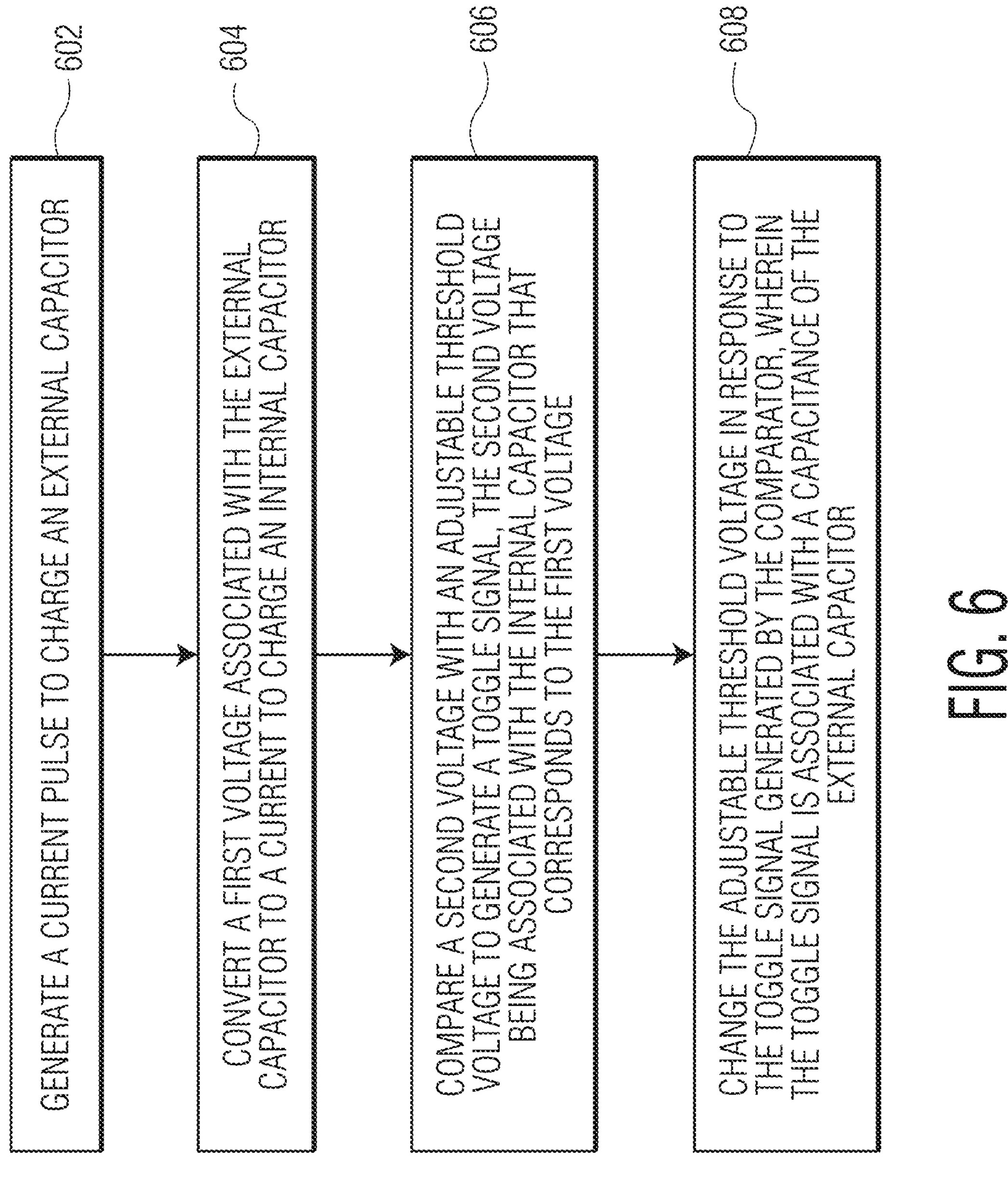
FIG. 6 is a process flow diagram of a method in accordance with an embodiment of the invention.

A method in accordance with an embodiment of the invention is described with reference to a process flow diagram of FIG. 6. At block 602, a current pulse is generated to charge an external capacitor. At block 604, a first voltage associated with the external capacitor is converted to current to charge an internal capacitor. At block 606, a second voltage is compared with an adjustable threshold voltage to generate a toggle signal. The second voltage is associated with the internal capacitor that corresponds to the first voltage. At block 608, the adjustable threshold voltage is changed in response to the toggle signal generated by the comparator. The toggle signal is associated with a capacitance of the external capacitor.

Although the operations of the method(s) herein are shown and described in a particular order, the order of the operations of each method may be altered so that certain operations may be performed in an inverse order or so that certain operations may be performed, at least in part, concurrently with other operations. In another embodiment, instructions or sub-operations of distinct operations may be implemented in an intermittent and/or alternating manner.

It can also be noted that at least some of the operations for the methods described herein may be implemented using software instructions stored on a computer useable storage medium for execution by a computer. As an example, an embodiment of a computer program product includes a computer useable storage medium to store a computer readable program.

The computer-useable or computer-readable storage medium can be an electronic, magnetic, optical, electromagnetic, infrared, or semiconductor system (or apparatus or device). Examples of non-transitory computer-useable and computer-readable storage media include a semiconductor or solid-state memory, magnetic tape, a removable computer diskette, a random-access memory (RAM), a read-only memory (ROM), a rigid magnetic disk, and an optical disk.

Alternatively, embodiments of the invention may be implemented entirely in hardware or in an implementation containing both hardware and software elements. In embodiments that use software, the software may include but is not limited to firmware, resident software, microcode, etc.

Although specific embodiments of the invention have been described and illustrated, the invention is not to be limited to the specific forms or arrangements of parts so described and illustrated. The scope of the invention is to be defined by the claims appended hereto and their equivalents.

What is claimed is:

1. A capacitance sensing circuit comprising:

- a current pulse generator configured to generate a current pulse to charge an external capacitor;
- a voltage-to-current converter to convert a first voltage associated with the external capacitor to current to charge an internal capacitor;
- a comparator operably connected to the internal capacitor to generate a toggle signal when a second voltage corresponding to the first voltage reaches an adjustable threshold voltage; and
- a processing unit operably connected to the comparator to change the adjustable threshold voltage in response to the toggle signal generated by the comparator, wherein the toggle signal is associated with a capacitance of the external capacitor.

2. The capacitance sensing circuit of claim 1, further comprising a resistor ladder connected to the comparator via switches to provide the adjustable threshold voltage.

3. The capacitance sensing circuit of claim 2, wherein the processing unit includes a switch controller configured to provide signals to the switches to control the adjustable threshold voltage.

4. The capacitance sensing circuit of claim 3, wherein the processing unit further includes flip-flops connected to provide input signals to the switch controller, wherein the flip-flops are connected to the comparator to receive the toggle signal to generate the input signals.

5. The capacitance sensing circuit of claim 4, wherein the flip-flops are connected such that an output of at least one of the flip-flops is an input to another one of the flip-flops.

6. The capacitance sensing circuit of claim 5, wherein the flip-flops are connected such that an output of a first flip-flop is an input to a second flip-flop, an output of the second flip-flop is an input to a third flip-flop, and an output of the third flip-flop is an input to a fourth flip-flop.

7. The capacitance sensing circuit of claim 4, wherein the switch controller includes AND gates connected to outputs of the flip-flops to generate the signals.

8. The capacitance sensing circuit of claim 1, wherein the voltage-to-current converter includes a current mirror connected to the internal capacitor, the current mirror being controlled by a transistor that is controlled by the first voltage.

9. The capacitance sensing circuit of claim 8, wherein the voltage-to-current converter further includes an amplifier connected to a control terminal of the transistor to control the transistor based on the first voltage.

10. The capacitance sensing circuit of claim 1, further comprising a discharge transistor connected to the internal capacitor and controlled by the toggle signal from the comparator to discharge the internal capacitor.

11. The capacitance sensing circuit of claim 1, wherein the current pulse generator includes a current generator and a timing circuit operably connected to the current generator to generate the current pulse.

12. A method comprising: generating a current pulse to charge an external capacitor; converting a first voltage associated with the external capacitor to current to charge an internal capacitor; comparing a second voltage with an adjustable threshold voltage to generate a toggle signal, the second voltage being associated with the internal capacitor that corresponds to the first voltage; and changing the adjustable threshold voltage in response to the toggle signal, wherein the toggle signal is associated with a capacitance of the external capacitor.

13. The method of claim 12, wherein changing the adjustable threshold voltage includes closing a switch connected to a resistor ladder to change the adjustable threshold voltage.

14. The method of claim 13, further comprising applying the toggle signal to flip-flops to generate a signal to close the switch.

15. A capacitance sensing circuit comprising:

- a current pulse generator configured to generate a current pulse to charge an external capacitor;

a voltage-to-current converter to convert a first voltage associated with the external capacitor to current to charge an internal capacitor;

a comparator operably connected to the internal capacitor to generate a toggle signal when a second voltage corresponding to the first voltage reaches an adjustable threshold voltage;

a resistor ladder connected to the comparator via switches to provide the adjustable threshold voltage; and a switch controller operably connected to the switches to provide signals to the switches to control the adjustable threshold voltage based on the toggle signal, wherein the toggle signal is associated with a capacitance of the external capacitor.

16. The capacitance sensing circuit of claim 15, further comprising flip-flops connected to provide input signals to the switch controller, wherein the flip-flops are connected to the comparator to receive the toggle switch to generate the input signals.

17. The capacitance sensing circuit of claim 16, wherein the flip-flops are connected such that an output of at least one of the flip-flops is an input to another one of the flip-flops.

18. The capacitance sensing circuit of claim 15, wherein the voltage-to-current converter includes a current mirror connected to the internal capacitor, the current mirror being controlled by a transistor that is controlled by the first voltage.

19. The capacitance sensing circuit of claim 15, further comprising a discharge transistor connected to the internal capacitor and controlled by the toggle signal from the comparator to discharge the internal capacitor.

20. The capacitance sensing circuit of claim 15, wherein the current pulse generator includes a current generator and a timing circuit operably connected to the current generator to generate the current pulse.

* * * * *